(12) United States Patent  
Belot et al.

(10) Patent No.: US 8,462,031 B2  
(45) Date of Patent: Jun. 11, 2013

(54) CONTINUOUS TIME ANALOGUE/DIGITAL CONVERTER

(75) Inventors: Didier Belot, Rives (FR); Jean-Baptiste Begueret, Bordeaux (FR); Yann Deval, Bordeaux (FR); Dominique Dallet, Villenave d'Ornon (FR); André Mariano, Bordeaux (FR)

(73) Assignees: STMicroelectronics SA, Montrouge (FR); Centre National de Recherche Scientifique (CNRS), Paris (FR)

( * ) Notice: Subject to any disclaimer, the term of this patent is extended or adjusted under 35 U.S.C. 154(b) by 143 days.

(21) Appl. No.: 13/024,729

(22) Filed: Feb. 10, 2011

(65) Prior Publication Data

US 2011/0200152 A1 Aug. 18, 2011

(30) Foreign Application Priority Data

Feb. 15, 2010 (FR) ...................... 10 51011

(51) Int. Cl.  
*H03M 3/02* (2006.01)
(52) U.S. Cl.  
USPC .......................................... 341/143; 341/155
(58) Field of Classification Search  
USPC ........................................................ 341/143  
See application file for complete search history.

(56) References Cited

U.S. PATENT DOCUMENTS

| | | | | |
|---|---|---|---|---|
| 4,939,516 A | * | 7/1990 | Early | 341/143 |
| 5,039,989 A | * | 8/1991 | Welland et al. | 341/143 |
| 6,020,836 A | * | 2/2000 | Tlaskal | 341/143 |
| 6,373,418 B1 | | 4/2002 | Abbey | |
| 6,489,907 B2 | * | 12/2002 | Cusinato et al. | 341/143 |
| 6,707,409 B1 | * | 3/2004 | Ignjatovic et al. | 341/143 |
| 7,928,877 B1 | * | 4/2011 | Kaplan | 341/143 |
| 8,149,896 B2 | * | 4/2012 | Filipovic | 375/147 |
| 2007/0153878 A1 | * | 7/2007 | Filipovic | 375/147 |
| 2010/0289682 A1 | * | 11/2010 | Groenewold | 341/143 |

OTHER PUBLICATIONS

Republique Francaise, Institut National De La Propriete Industrielle, Rapport de Recherche Preliminaire (Preliminary Search Report), issued in French Patent Application No. 10/51011 on Oct. 7, 2010 (2 pages).

Chang et al., "Chopper-Stabilized Sigma-Delta Modulcator," IEEE 1993, 0-7803-1254-6/93 (pp. 1286-1289).

* cited by examiner

*Primary Examiner* — Khai M Nguyen  
(74) *Attorney, Agent, or Firm* — Slater & Matsil, L.L.P.

(57) ABSTRACT

Continuous time analogue/digital converter, comprising a sigma delta modulator (MSD1) configured to receive an analogue input signal (x(t)) and comprising high-pass filtering means (MF) the chopping frequency of which is equal to half of the sampling frequency (Fs) of the quantization means (QTZ) of the modulator (MSD1).

20 Claims, 4 Drawing Sheets

CONTINUOUS TIME ANALOGUE/DIGITAL CONVERTER

This application claims the benefit of French Patent Application No. FR 10-51011, filed on Feb. 15, 2010, entitled "Continuous Time Analogue/Digital Converter," which application is hereby incorporated herein by reference to the maximum extent allowable by law.

TECHNICAL FIELD

The invention relates to the continuous-time conversion of analogue signals to digital signals and applies advantageously but not limitingly to the radio-frequency field, for example in mobile telephony, in which the radiofrequency circuits mostly use analogue/digital conversion devices both in transmission and reception.

BACKGROUND

These conversion devices are usually produced within integrated circuits. They may be continuous time (or CT according to the term commonly used by those skilled in the art) or else discrete time (or DT according to the term commonly used by those skilled in the art).

Usually, this conversion is carried out with the aid of a sigma delta modulator because it provides a good resolution of conversion and rejects quantization noise outside the payload band of the signal.

FIG. 1 illustrates schematically an example of a structure usually used for sigma delta modulators within a continuous time converter CT. The structure of sigma delta modulators is usually based on the combination of an integrator and a summer, the assembly being looped. The diagram of a sigma delta modulator is therefore that of a closed-loop control system.

The sigma delta modulator MSD comprises at the head a summer SOM (subtractor) receiving an analogue input signal x(t) having a frequency Fe. This subtractor is in this instance followed by an integrator INT the output of which is connected to the input of a quantization means QTZ (sampler) the output of which forms the output of the modulator. The output of the quantization means QTZ is looped back to the negative input of the summer SOM by means of a digital/analogue converter DAC. The quantization means QTZ converts the signal from the integrator INT into a digital signal y(n). Moreover, the modulator MSD comprises a clock generator CLK in order to generate a sampling frequency Fs intended for the quantization means QTZ and for the converter DAC.

The "delta" modulation is based on the quantization of the modification of the analogue input signal x(t). The presence of a "sigma" integrator in the modulator gives the modulator the title of "sigma delta" modulator. The integrator usually comprises a low-pass filter This being so, there are also bandpass sigma delta modulators which comprise, instead of an integrator, a bandpass filter. These modulators, although they have no integrator, still retain, the title "sigma delta modulator".

In practice, in radio-frequency applications, use is made of a bandpass filter and a sampling frequency Fs which is approximately equal to four times the frequency of the analogue input signal x(t). Since the sampling frequency is very high, this modulator MSD does not make it possible to convert high-frequency analogue signals; usually the frequency of the input signals is limited to a few gigahertz.

Moreover, as indicated above, in order to convert the analogue signals, it is also possible to use a discrete time analogue/digital converter DT. These converters also use sigma delta modulators but unlike the continuous-time use described above, these modulators receive a sampled signal as an input. These converters also comprise a first frequency mixer situated upstream of the modulator in order on the one hand to sample the analogue input signal and on the other hand to transpose the frequency of the input signal around a carrier frequency. Then the modulator converts the sampled signal received into a digital output signal. This converter also comprises a second mixer situated at the output of the modulator in order to again transpose the frequency of the digital output signal around the frequency of the input signal.

Sampling the analogue input signal makes it possible to use a sampling frequency value for the sigma delta modulator that is lower than that used in the continuous time converter CT described above. Specifically, for a discrete time converter DT, the sampling frequency is approximately equal to twice the frequency of the analogue input signal.

These discrete time converters DT do not make it possible to convert the analogue signals at frequencies higher than the continuous time converters CT. Moreover, they have a complex architecture because they use two frequency mixers.

SUMMARY OF THE INVENTION

In one aspect, the present invention provides for a continuous time analogue/digital converter. The converter includes a sigma delta modulator configured to receive an analogue input signal. The modulator includes a quantization means having a sampling frequency; and a high-pass filtering means having a chopping frequency that is equal to half of the sampling frequency of the quantization means.

In another aspect, the present invention provides for a wireless communication device having a sigma delta modulator configured to receive an analogue input signal. The modulator includes a quantization means having a sampling frequency, and a high-pass filter having a chopping frequency that is equal to half of the sampling frequency of the quantization means.

In yet another aspect, the present invention provides for a method comprising: receiving an analogue input signal and adding to the analogue input signal a feedback signal to generate a modified analogue signal. The method further includes passing the modified analogue signal through a high-pass filter and filtering out a portion of the analogue signal having a frequency below a chopping frequency, the chopping frequency being approximately half a sampling frequency, to produce a filtered analogue signal. The method further includes quantizing the filtered analogue signal at the sampling frequency to produce a digital signal, and converting the digital signal to an analogue signal to generate the feedback signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
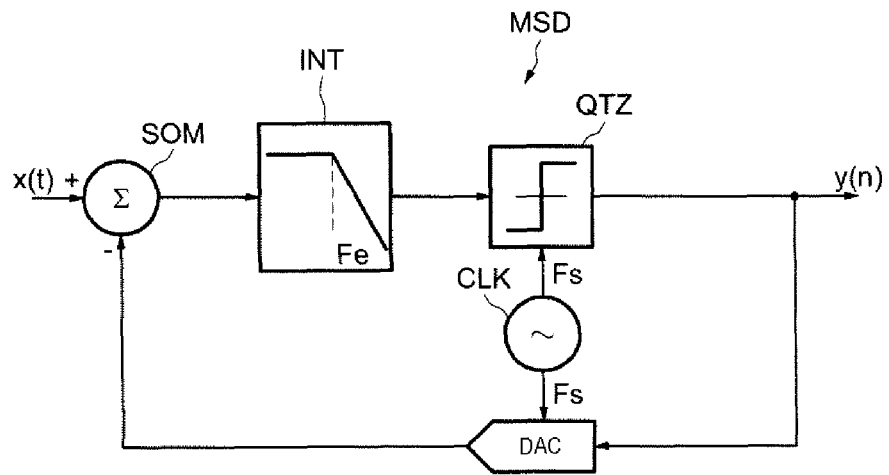
FIG. 1 illustrates a delta modulator used in the continuous time converters CT according to the prior art.

Before addressing specific embodiments in detail, a brief overview of the various embodiments, and potential advantages thereof is provided. According to one embodiment, a system is proposed for converting analogue signals at the highest possible frequency that is not very costly and less complex than those described above.

Advantageously, a converter is proposed that can directly convert an analogue signal with the aid of a sigma delta modulator that is adapted without having to process the analogue input signal upstream of the modulator. Moreover, it may be advantageous to reduce the low-frequency noise associated with the processing of the analogue signal during its conversion to a digital signal. According to one aspect, a continuous time analogue/digital converter is proposed that comprises a sigma delta modulator configured to receive an analogue input signal. This modulator comprises high-pass filtering means the chopping frequency of which is equal to half of the sampling frequency of the quantization means of the said modulator. Therefore, the analogue input signal is converted directly at high frequencies, reducing the complexity of the converter.

Advantageously, no mixers are used for processing the input signal upstream of the modulator. By virtue of a high-pass filtering means, the bandwidth of the converter is increased for a given sampling frequency of the modulator. The sampling frequency of the sigma delta modulator may advantageously be approximately equal to twice the frequency of the analogue input signal. The high-pass filtering means may be produced with the aid of a simple high-pass filter or else from one or more resonators.

Therefore, according to one embodiment, the modulator comprises at least one summer, and the filtering means comprise at least one unit comprising a resonator and a variable-gain amplifier coupled between the output of the quantization means and an input of the at least one summer, the gain of the said variable-gain amplifier being fixed at a value for which the resonance frequency of the said resonator is equal to the said chopping frequency.

Therefore, by the use of a resonator, the accuracy of the filtering means is increased, that is to say that the low-frequency noise is more effectively pushed outside the payload frequency band of the analogue signal. It will be noted that this accuracy increases with the number of resonators used. The resonators make it possible to obtain a signal gain at the resonance frequency of the resonator which is higher than the gain of a conventional high-pass filter. Moreover, variable-gain amplifiers make it possible to adapt the sigma delta modulator according to the frequency of the input signal. According to another embodiment, the unit comprises at least one other variable-gain amplifier, the gains of all the amplifiers of the said unit being respectively fixed at values for which the resonance frequency of the said resonator is equal to the said chopping frequency. This improves the accuracy of each resonator. The modulator may also comprise a delay means coupled between the output of the quantization means and the input of one of the amplifiers of the said unit and configured to delay the digital output signal of the quantization means by a delay equal to half of the sampling period of the quantization means.

According to yet another embodiment, the filtering means comprise at least one other unit. The converter as defined above may be produced in integrated form within an integrated circuit. The various components of the converter may be produced in the form of specific logic or other circuits, or else in the form of software modules within a microprocessor. It will be noted here that the design of the high-pass filters on the integrated circuits, in particular in CMOS technology, is easier to achieve than for bandpass filters.

According to another aspect, a wireless communication device is proposed comprising a converter as defined above.

Figure 2:
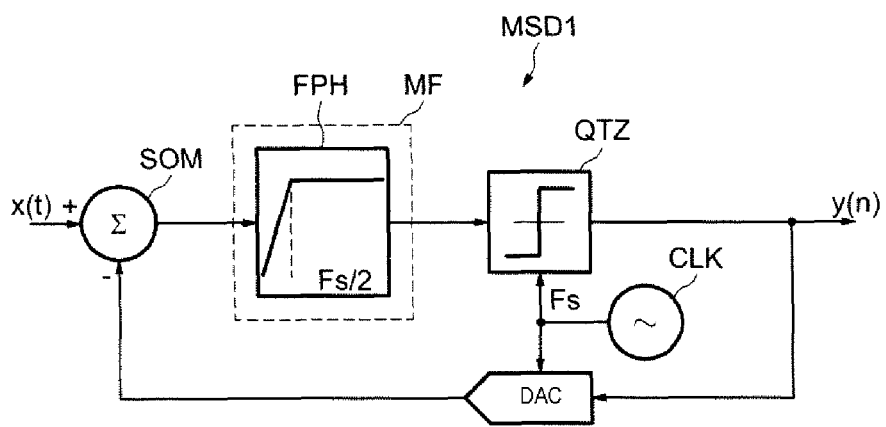
FIG. 2 illustrates schematically an embodiment of a continuous time analogue/digital converter according to an embodiment of the invention.

FIG. 2 shows schematically a continuous time analogue/digital converter according to one embodiment of the invention comprising a sigma delta modulator MSD1 in which the sampling frequency Fs of the quantization means QTZ is approximately equal to twice the frequency Fe of the analogue input signal x(t). Moreover, the sigma delta converter comprises a decimation filter, not shown for simplification purposes, coupled to the output of the quantization means QTZ. The modulator MSD1 comprises high-pass filtering means MF. These high-pass filtering means MF comprise in this instance a high-pass filter FPH the chopping frequency Fc of which is approximately equal to half the sampling frequency Fs of the quantization means QTZ. This high-pass filtering means also makes it possible to eliminate the low-frequency noise.

Figure 3:
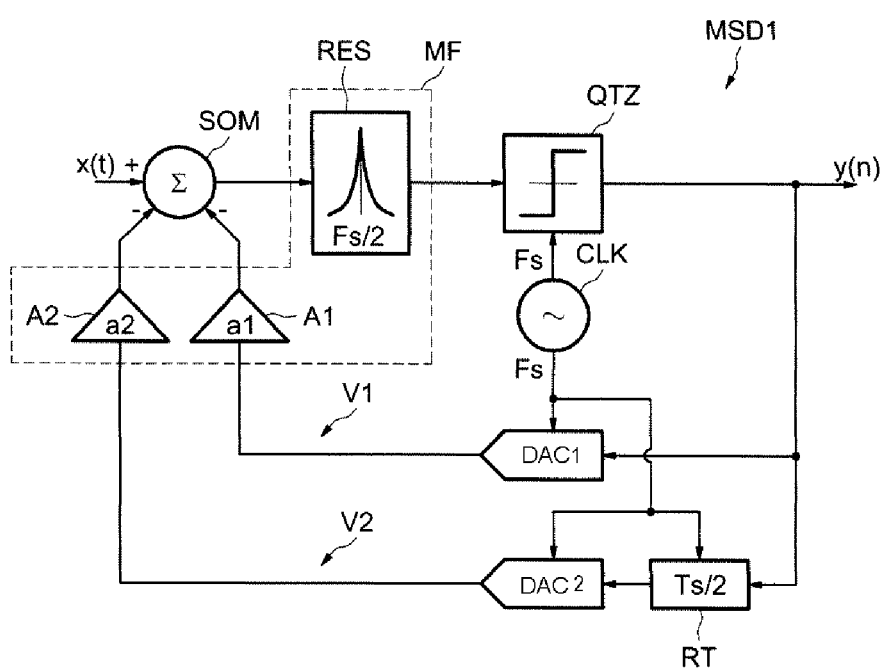
FIGS. 3 and 4 illustrate schematically other embodiments of a continuous time analogue/digital converter.

FIG. 3 illustrates schematically another embodiment of the continuous time analogue/digital converter. In this embodiment, the filtering means MF comprises a unit comprising a resonator RES, a first amplifier A1 with variable gain a1 and a second amplifier A2 with variable gain a2. This gives a high-pass filtering means of the second order, because the latter comprises a resonator RES with two variable parameters that are the variable gains a1, a2.

The modulator MSD1 of FIG. 3 comprises two channels V1, V2 in order to loop back the digital output signal y(n) to respectively two negative inputs of the summer SOM.

The first channel V1 comprises a first digital/analogue converter DAC1 coupled between the output of the quantization means QTZ and the first amplifier A1, the latter being coupled to the first negative input of the summer SOM.

The second channel V2 comprises a second digital/analogue converter DAC2 coupled between a delay means RT and the second amplifier A2, the latter being coupled to the second negative input of the summer SOM. The delay means RT is also coupled between the output of the quantization means QTZ and the second digital/analogue converter DAC2. This delay means RT makes it possible to delay the digital signal y(n) leaving the quantization means QTZ by a period equal to half the sampling period Ts of the modulator MSD1.

It will be noted that a resonator is a system which oscillates naturally at a precise frequency Fr which is its resonance frequency. The variable gains a1, a2 are determined as a function of the frequency Fe of the analogue input signal x(t) in order to obtain a resonance frequency Fr of the resonator that is approximately equal to half the sampling frequency Fs of the modulator MSD1.

It will also be noted that, for a conventional high-pass filter, the gain is usually between 20 and 30. On the other hand, for a resonator, the gain is between 300 and 400. Moreover, the resonators are precise and have a resonance difference of ±3 dB (decibels).

Figure 4:
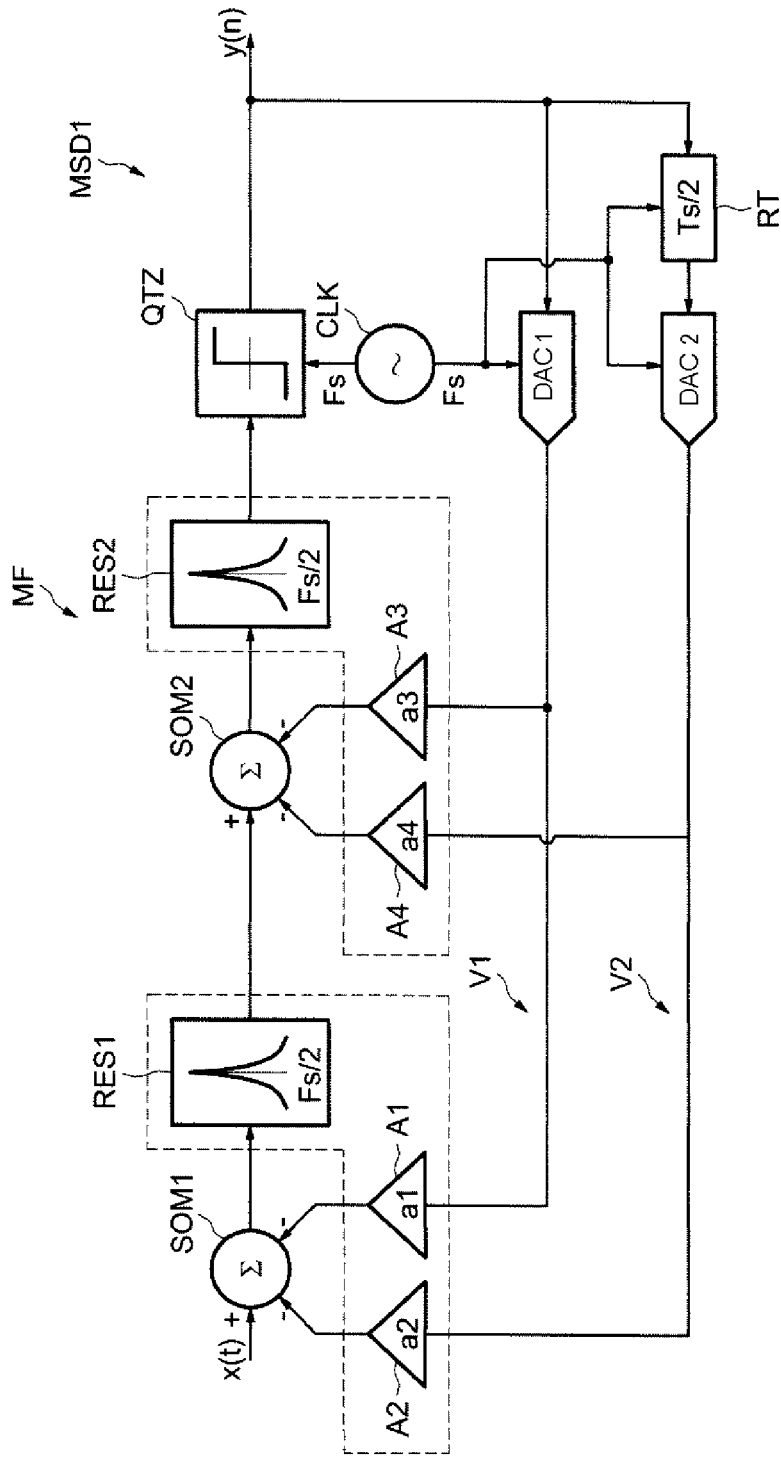

FIG. 4 illustrates a schematic representation of another embodiment of the continuous time analogue/digital converter. Certain elements described in the previous figures have also been transferred to this FIG. 4. In this other embodiment, the filtering means FPH comprise two units comprising respectively two resonators RES1, RES2 mounted in series in order to obtain a fourth-order high-pass filtering means. Each resonator is preceded by a summer SOM1, SOM2. The number of units, and in particular the number of resonators mounted in series, is not limiting and it is possible to produce filtering means which comprise more than two resonators in order to improve the precision of the filtering means MF. However, if the number of resonators is increased, the processing time is also increased for the conversion of the analogue signal x(t). This is why the use of two resonators provides a good compromise between precision and processing time for the digital conversion.

Moreover, the filtering means MF comprise, in a first unit, a first amplifier A1 with variable gain a1 and a second amplifier A2 with variable gain a2. These filtering means MF also comprise, in a second unit, a third amplifier A3 with variable gain a3 and a fourth amplifier A4 with variable gain a4.

As a non-limiting example, the continuous time analogue/digital converter may comprise a sigma delta modulator furnished with two resonators to convert an analogue input signal having a frequency Fe=2 GHz, with a sampling frequency Fs=4 GHz.

Figure 5:
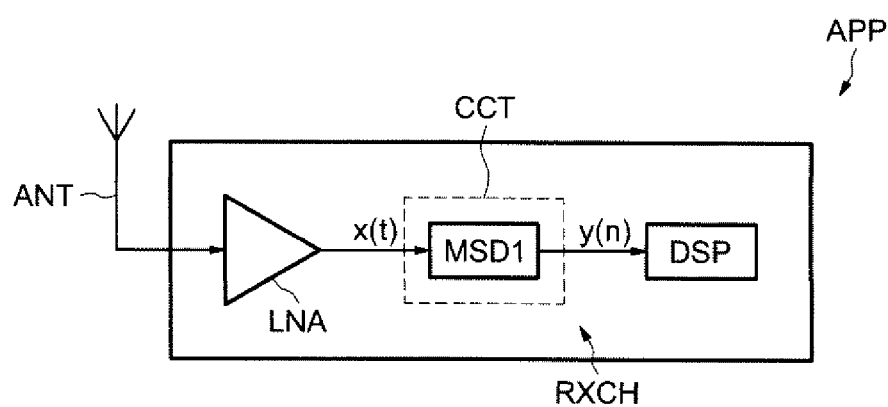
FIG. 5 illustrates schematically an example of a wireless communication device incorporating a continuous time converter.

FIG. 5 shows schematically a wireless communication device APP. This wireless communication device APP comprises an antenna ANT for transmitting and receiving signals for communication with a remote base station. This device APP conventionally comprises a receive chain RXCH and a transmit chain, not shown here for simplification purposes.

The receive chain RXCH comprises an analogue portion comprising in particular a low noise amplifier LNA connected to a continuous time analogue/digital converter CCT which comprises a sigma delta modulator MSD1 as described above for converting the analogue input signal x(t) into a digital signal y(n) intended for a digital signal processor DSP.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A continuous time analogue/digital converter, comprising:
   a sigma delta modulator configured to receive an analogue input signal and including a quantization means having a sampling frequency; and
   a high-pass filtering means having a chopping frequency that is equal to half of the sampling frequency of the quantization means.

2. The converter according to claim 1, in which the sigma delta modulator comprises at least one summer and the high-pass filtering means comprises at least one unit including a resonator and a variable-gain amplifier coupled between an output of the quantization means and an input of the at least one summer, the gain of said variable-gain amplifier being fixed at a value for which a resonance frequency of the said resonator is equal to said chopping frequency.

3. The converter according to claim 2, in which the at least one unit comprises at least one other variable-gain amplifier, the gains of all the amplifiers of said at least one unit being respectively fixed at values for which the resonance frequency of the said resonator is equal to said chopping frequency.

4. The converter according to claim 3, in which the said sigma delta modulator also comprises a delay means coupled between the output of the quantization means and the input of one of the amplifiers of the at least one unit and configured to delay a digital output signal of the quantization means by a delay equal to half of a sampling period of the quantization means.

5. The converter according to claim 2, in which the high-pass filtering means comprise at least one other unit.

6. The converter according to claim 1, produced in integrated form within an integrated circuit.

7. The converter of claim 1, wherein the sampling frequency is 4 GHz and the chopping frequency is 2 GHz.

8. A wireless communication device comprising:
   a sigma delta modulator configured to receive an analogue input signal and including a quantization means having a sampling frequency; and
   a high-pass filter having a chopping frequency that is equal to half of the sampling frequency of the quantization means.

9. The wireless communication device of claim 8, in which the sigma delta modulator comprises a summer and the high-pass filter comprises a resonator and a gain amplifier coupled between an output of the quantization means and an input of the summer, the gain of the amplifier being at a value for which a resonance frequency of the resonator is equal to said chopping frequency.

10. The wireless communication device of claim 9, in which the high-pass filter further comprises a second amplifier, the gain of the second amplifier being at a value for which the resonance frequency of the resonator is equal to said chopping frequency.

11. The wireless communication device of claim 10, in which said sigma delta modulator further includes a delay means coupled between the output of the quantization means and an input of one of amplifier or second amplifier, the delay means being configured to delay a digital output signal of the quantization means by a delay equal to half of a sampling period of the quantization means.

12. The wireless communication device of claim 10, in which the high-pass filter further includes a second resonator, a third amplifier and a fourth amplifier.

13. The wireless communication device of claim 9, further comprising a receive chain and a transmit chain.

14. A method comprising:
   receiving an analogue input signal;
   adding to the analogue input signal a feedback signal to generate a modified analogue signal;
   passing the modified analogue signal through a high-pass filter, filtering out a portion of the analogue signal having a frequency below a chopping frequency, the chopping frequency being approximately half a sampling frequency, to produce a filtered analogue signal;
   quantizing the filtered analogue signal at the sampling frequency to produce a digital signal; and converting the digital signal to an analogue signal to generate the feedback signal.

15. The method of claim 14, further comprising amplifying the feedback signal with a gain, the gain being at a value to produce a resonance frequency equal to said chopping frequency.

16. The method of claim 15, wherein the gain is between 300 and 400.

17. The method of claim 14, further comprising:
converting the digital signal to an analogue signal to generate a first feedback signal;
delaying the digital signal and converting the delayed digital signal to a second analogue signal to generate a second feedback signal; and
amplifying both the first feedback signal and the second feedback signal before adding the first feedback signal and the second feedback signal to the analogue input signal.

18. The method of claim 17, wherein delaying the digital signal comprises delaying the digital signal by one half a period of the sampling frequency.

19. The method of claim 14, wherein the sampling frequency is 4 GHz and the chopping frequency is 2 GHz.

20. A continuous time analogue/digital converter, comprising:
a sigma delta modulator configured to receive an analogue input signal;
a quantizer having a sampling frequency; and
a high-pass filter having a chopping frequency, the chopping frequency being equal to half of the sampling frequency, wherein the high-pass filter comprises a resonator.

* * * * *